(12) United States Patent
Matsuzaki et al.

(10) Patent No.: US 8,429,815 B2
(45) Date of Patent: Apr. 30, 2013

(54) MANUFACTURING METHOD OF SUBSTRATE, MANUFACTURING METHOD OF WIRING BOARD, WIRING BOARD, ELECTRONIC DEVICE, ELECTRON SOURCE, AND IMAGE DISPLAY APPARATUS

(75) Inventors: Naoki Matsuzaki, Yokohama (JP); Kazuya Ishiwata, Yokosuka (JP); Hiroaki Toshima, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 1218 days.

(21) Appl. No.: 12/298,962

(22) PCT Filed: Jun. 29, 2007

(86) PCT No.: PCT/JP2007/063527
§ 371 (c)(1),
(2), (4) Date: Oct. 29, 2008

(87) PCT Pub. No.: WO2008/013039
PCT Pub. Date: Jan. 31, 2008

(65) Prior Publication Data
US 2009/0091916 A1    Apr. 9, 2009

(30) Foreign Application Priority Data
Jul. 28, 2006   (JP) ................................. 2006-206053

(51) Int. Cl.
*H05K 3/02*     (2006.01)
*H05K 3/10*     (2006.01)
*H05K 1/09*     (2006.01)

(52) U.S. Cl.
USPC ............................................. 29/846; 174/251

(58) Field of Classification Search .................... 29/846, 29/849, 851, 855; 427/96.1; 174/251; 430/320
See application file for complete search history.

(56) References Cited

U.S. PATENT DOCUMENTS

| | | | |
|---|---|---|---|
| 3,075,860 A * | 1/1963 | Veres .............................. | 65/33.4 |
| 3,568,127 A * | 3/1971 | Aimi .............................. | 338/262 |
| 3,617,373 A * | 11/1971 | Mott .............................. | 216/17 |
| 3,721,594 A * | 3/1973 | Tarnopol et al. ........... | 156/89.17 |

(Continued)

FOREIGN PATENT DOCUMENTS

| | | |
|---|---|---|
| EP | 1306872 A2 | 5/2003 |
| EP | 1506944 A1 | 2/2005 |

(Continued)

OTHER PUBLICATIONS

X. Li et al., "Laser Direct Fabrication of Silver Conductors on Glass Boards," 483(1-2) Thin Solid Films 270-75 (Jul. 2005).

*Primary Examiner* — David Angwin
(74) *Attorney, Agent, or Firm* — Fitzpatrick, Cella, Harper & Scinto

(57) ABSTRACT

A method for manufacturing an electronic substrate structure comprising a substrate, a glass layer, and a conductive layer. This method may include the steps of arranging the glass layer on the substrate, arranging the conductive layer that includes a precious metal particle on the glass layer while directly contacting the glass layer, and heating the glass layer together with the conductive layer at a temperature that is lower than a softening point of the glass layer so that the particle is put into the glass layer. The particle has a diameter of not less than 1 μm and not more than 10 μm.

7 Claims, 7 Drawing Sheets

U.S. PATENT DOCUMENTS

| | | | | |
|---|---|---|---|---|
| 3,721,595 A * | 3/1973 | Tarnopol et al. | ............ | 156/89.17 |
| 3,841,883 A * | 10/1974 | Sherk et al. | ...................... | 501/15 |
| 3,845,443 A * | 10/1974 | Fisher | ............................ | 338/25 |
| 3,873,330 A * | 3/1975 | Sherk et al. | ...................... | 501/15 |
| 3,961,114 A * | 6/1976 | Berkenblit et al. | ............. | 428/38 |
| 4,313,022 A * | 1/1982 | Jordan et al. | .................. | 136/244 |
| 4,454,167 A * | 6/1984 | Bernot et al. | ................. | 430/198 |
| 4,942,110 A * | 7/1990 | Genovese et al. | ............. | 430/198 |
| 4,975,301 A * | 12/1990 | Andrews et al. | ............ | 427/126.2 |
| 5,446,616 A * | 8/1995 | Warren | ...................... | 361/283.2 |
| 5,512,353 A * | 4/1996 | Yokotani et al. | ............. | 428/210 |
| 5,980,017 A * | 11/1999 | Sato | ............................... | 347/20 |
| 6,197,480 B1 * | 3/2001 | Iguchi et al. | ................ | 430/286.1 |
| 6,248,964 B1 * | 6/2001 | Bailey et al. | .............. | 200/11 DA |
| 6,651,871 B2 * | 11/2003 | Ogure | ........................ | 228/248.1 |
| 6,656,665 B1 * | 12/2003 | Demars et al. | ................ | 430/322 |
| 2003/0129546 A1 * | 7/2003 | Mitsui et al. | .................. | 430/320 |
| 2005/0037910 A1 * | 2/2005 | Konno | ............................ | 501/20 |
| 2006/0189745 A1 * | 8/2006 | Mitsui et al. | .................. | 524/494 |

FOREIGN PATENT DOCUMENTS

| | | |
|---|---|---|
| JP | 2004-342547 A | 12/2004 |
| JP | 2005-190769 A | 7/2005 |
| JP | 2005-216639 A | 8/2005 |

* cited by examiner

FIG.7

| COMPOSITION | TRANSITION POINT | SOFTENING POINT | AG DIAMETER | 380°C | 400°C | 420°C | 440°C | 460°C | 480°C | 500°C |
|---|---|---|---|---|---|---|---|---|---|---|
| Bi₂O₃, ZnO, BaO: 60~70wt% | 485°C | 510°C | 20nm | × | × | × | × | × | × | × |
| | | | 0.3μm | × | × | × | × | × | × | × |
| | | | 1μm | × | × | × | ● | ● | ● | ● |
| | | | 2~3μm | × | × | × | × | ● | ● | ● |
| | | | 4~7μm | × | × | × | × | × | ● | ● |
| | | | 8~10μm | × | × | × | × | × | ● | ● |

MANUFACTURING METHOD OF SUBSTRATE, MANUFACTURING METHOD OF WIRING BOARD, WIRING BOARD, ELECTRONIC DEVICE, ELECTRON SOURCE, AND IMAGE DISPLAY APPARATUS

TECHNICAL FIELD

The present invention relates to a manufacturing method of a substrate. In addition, the present invention relates to a substrate provided with a wiring (a wiring board) and particularly, the present invention relates to a wiring board used for an electronic device such as a liquid crystal display, a plasma display, and a display using an electron-emitting device.

BACKGROUND ART

A flat type apparatus for displaying an image (flat panel display) such as a liquid crystal display (LCD), a plasma display (PDP), an EL display (ELD), and a display using an electron-emitting device disclosed in Patent Documents 1 to 3 or the like is a display having many pixels arranged in plane. Such a display is provided with a wiring board having a plurality of wirings on a substrate made of glass or the like and a display is formed by mounting various functional devices such as a TFT and an electron-emitting device disposed on the wiring board.

[Patent Document 1] Japanese Patent Application Laid-Open No. 2004-342547
[Patent Document 2] Japanese Patent Application Laid-Open No. 2005-190769
[Patent Document 3] Japanese Patent Application Laid-Open No. 2005-216639

DISCLOSURE OF INVENTION

A plurality of wirings of the above-described display apparatus is configured with an X-directional wiring and a Y-directional wiring that are layered with an insulating layer in between. These wirings are formed by depositing a conductive material on a surface of a substrate using a printing method or the like. In many cases, these wirings and insulating layers are layered on a flat glass substrate surface. On the other hand, in accordance with progress of high definition of a display, a measurement allowed per pixel is getting smaller. If the wiring is simply narrowed, a wiring resistance is increased, so that a cross section of the wiring should be increased and this results in increase of a thickness of the wiring. However, when the wiring becomes too thick, problems in accuracy of the wiring itself or a forming method may arise. In addition, the wiring to be arranged on the upper side is formed so as to get over a difference formed by the thickness of the wiring to be arranged on the lower side and/or the thickness of the insulating layer. Therefore, particularly, the shape of the wiring located on the insulating layer tends to depend on patterns (concavity and convexity) of the wiring and the insulating layer located on the lower side and this leads to that the concavity and convexity (the difference) become large.

Particularly, according to a display using an electron-emitting device, a trajectory of an electron emitted from the electron-emitting device may be influenced by a shape and a potential of a peripheral structure and it is necessary for the surface of the wiring board to be made into a flat shape with a concavity and a convexity as little as possible. In addition, it is not only a problem for a display using the electron-emitting device but also a problem which is common to other displays and electronic devices having various functional devices mounted on a wiring board.

In addition, in the above-described patent documents 1 to 3, a wiring board having a wiring disposed in a groove formed on the substrate is disclosed. However, according to this method, a step of forming a groove on the substrate itself is needed and this makes a manufacturing process complicated.

The present invention has been made taking the foregoing problems into consideration and an object of which is to provide a method for easily manufacturing a substrate (a wiring board) provided with a flat surface-shape.

(1) The present invention is made in order to attain the foregoing object. A first aspect of the present invention is a method for manufacturing a substrate, comprising the steps of: preparing a structure including a glass layer and a precious metal particle having a diameter not less than 1 µm and not more than 10 µm disposed on the glass layer while contacting thereto; and putting the precious metal particle in the glass layer by heating the structure at a temperature which is lower than a softening point of the glass layer.

(2) A second aspect of the present invention is a method for manufacturing a substrate, comprising the steps of: preparing a structure including a glass layer and a plurality of precious metal particles having a diameter not less than 1 µm and not more than 10 µm disposed on the glass layer while contacting thereto; and inserting glass composing the glass layer among the plurality of precious metal particles by heating the structure at a temperature which is lower than a softening point of the glass layer.

(3) A third aspect of the present invention is a manufacturing method of a wiring board, comprising the steps of: preparing a substrate having a glass layer and a first layer including a plurality of precious metal particles having a diameter not less than 1 µm and not more than 10 µm and disposed on the glass layer while contacting thereto; and inserting glass composing the glass layer among the plurality of precious metal particles composing the first layer by heating the substrate at a temperature which is lower than a softening point of the glass layer.

(4) A wiring board according to a fourth aspect of the present invention is manufactured by the manufacturing method described in (3).

(5) An electronic device according to a fifth aspect of the present invention may comprise the wiring board described in (4) and a functional device which is connected to a wiring of the wiring board.

(6) An electron source according to a sixth aspect of the present invention may comprise a wiring board described in (4) and an electron-emitting device which is connected to a wiring of the wiring board.

(7) An image display according to a seventh aspect of the present invention may comprise an electron source described in (6) and a light-emitting member emitting a light due to irradiation of an electron emitted from the electron source.

According to the present invention, it is possible to obtain a substrate (a wire board) which is excellent in a surface flatness by a simple method.

BRIEF DESCRIPTION OF DRAWINGS

FIG. 7 is a table showing a condition (a particle diameter and a heating temperature) that the silver particles are put in the glass layer.

1, 11, 31 ... substrate
2, 12, 33 ... glass layer
3, 13, 34 ... silver particle

BEST MODE FOR CARRYING OUT THE INVENTION

Preferred embodiments of the present invention will be described in detail below with reference to the drawings. Here, the present invention is not limited to the measurement, the material, the shape, and their relative positions or the like of the components described in the present embodiment unless particularly described in limitedly. In addition, a wiring board formed by using the method according to the present invention can be applied to the above-described LCD, PDP, ELD, and FED (a field emission type display). Further, a field emission type display is a display using a field emission type electron-emitting device. And, various electronic devices can be also configured by connecting another functional device such as a TFT and a wiring of a wiring board formed by using the manufacturing method of the present invention.

Hereinafter, a method according to the present invention will be described with reference to the drawings.

FIG. 1 is a cross sectional view for showing a process for putting precious metal particles in a glass layer according to a first embodiment of the present invention.

(Step 1)

Figure 1A:
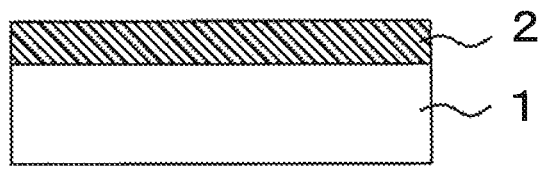
FIGS. 1A to 1C are cross sectional views for showing a process for putting silver particles in a glass layer according to a first embodiment of the present invention.

A substrate 1 provided with a glass layer 2 is prepared (FIG. 1A).

A material of the substrate 1 is not limited particularly unless the material is deformed with a heating temperature at least when silver particles are put in the glass layer 2 in a step to be described later. However, as the substrate 1, a glass having a high molding property may be preferably used. In the case of using a glass as the substrate 1, a glass with a strain point higher than a heating temperature in various steps such as a step 2 and a step 3 to be described later. As such a glass substrate, for example, a silica glass can be used. However, since a silica glass having a large area is expensive, for practical purposes, a high strain point glass that is generally used for a plasma display (for example, PD200 (a softening point: 830° C., an annealing point: 620° C., and a strain point: 570° C.) manufactured by ASAHI GLASS CO., LTD.) can be used. Alternatively, an alkali-free glass (a softening point: about 600° C.) and a soda lime glass can be also used, which are generally used for a liquid display. The soda lime glass has various components but its softening point is about 735° C., its annealing point is about 554° C., and its strain point is about 511° C.

The glass layer 2 can be formed, for example, by printing an insulating paste (a paste including a glass frit) on the substrate 1 and firing the substrate. Such an insulating paste is a paste which can be printed (namely, a printing paste) including many low-melting point glass particles (low-melting point glass frits). A glass frit means a piece of glass (a powder or a flake) and the glass frit is generally included in a particle. By printing and firing such an insulating paste on the substrate 1 using a screen-printing method, glass layer 2 with an approximately predetermined pattern can be provided on the substrate 1.

In addition, by using a photosensitive insulating paste (an insulating photo paste) having photosensitive materials mixed, a patterning can be carried out by a light. Therefore it is particularly preferable to use a photosensitive insulating paste because patterning can be carried out by a light and this makes it possible to carry out patterning of the glass layer 2 with a higher accuracy as compared to a screen printing method. According to a method using a photosensitive insulating paste, at first, a coating film is formed on the substrate 1 using a paste made of an inorganic material component containing a low-melting point glass frit as a primary component and a photosensitive organic material component. Then, by exposing the coating film through a photo mask to develop, a predetermined pattern is formed. Then, by firing the pattern, an insulating layer (a glass layer) is obtained. It is preferable that the amount of the inorganic material contained in the paste is 65 to 85 wt % of a sum of the inorganic material and the organic material. In addition, it is obvious that the glass layer 2 can be formed by a general developing method such as a spatter method.

Further, as a low-melting point glass, namely, a glass with a low glass transition point, for example, ones with a glass transition point no more than 500° C., for example, a mixture of $Bi_2O_3$, Zn, and BaO, a mixture of BaO, $B_2O_3$, ZnO, and $SiO_2$ or the like can be preferably used. Here, low-melting point glass frits of a bismuth oxide are exemplified, however, a low-melting point glass frit of a lead oxide may be also used. As an example of a low-melting point glass of bismuth oxide, for example, a glass containing 10 to 60 wt % of bismuth oxide, 3 to 50 wt % of silicon oxide, 10 to 40 wt % of boric oxide, 5 to 20 wt % of a barium oxide, and 10 to 20 wt % of a zinc oxide where a wt % of the low-melting point glass is 100 may be exemplified. A low-melting point glass of a bismuth oxide may be translated into a low-melting point glass containing a bismuth oxide. However, a low-melting point glass which can be used for the present invention is not limited to the above-described composition.

In addition, in the case of using the glass substrate as the above-described substrate 1, it is necessary to select a glass substrate having a higher strain point than a heating temperature (for example, a firing temperature) required for a forming step of the glass layer 2.

The glass layer 2 may function as a dielectric layer (an insulating layer).

(Step 2)

Figure 1B:
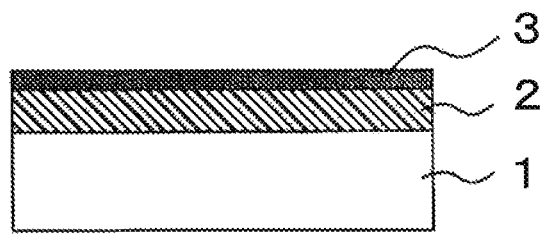

Next, precious metal particles 3 are arranged on the glass layer 2 (FIG. 1B).

As a precious metal to be used, silver is particularly preferable. A wiring made of many silver particles 3 (a wiring made of a sintered body made of many silver particles) has a very low resistance and is provided with a property such that it can be easily treated. A particle diameter (a diameter) of a precious metal particle 3 represented by a silver particle 3 is not less than 1 μm and not more than 10 μm (preferably, not less than 1 μm and not more than 4 μm). The precious metal particle 3 may contain a precious metal as a primary component, and preferably, a component of the precious metal contained in the precious metal particle 3 is not less than 70 atm % and preferably, not less than 80 atm %. Similarly, the silver particle 3 may contain silver as a primary component, and particularly, a component of silver contained in the particle 3 is not less than 70 atm % and preferably, not less than 80 atm %. Taking the case using a silver particle as a precious metal particle as an example, the explanation will be given below.

As a method of disposing the silver particle 3 on the glass layer 2, a method of printing a paste containing the silver particle 3 on the glass and firing the glass can be preferably used. Further, various methods such as a method for applying the silver particle 3 on the glass layer 2 using a dispenser or a method for spray-applying the silver particle 3 can be also used.

A paste containing many silver particles 3 (a silver paste) may contain a low-melting point glass frit other than the silver particles 3, however, such a glass frit is not essential for the present invention. In the paste containing the low-melting point glass frit, a contained amount of the glass frit in the paste is sufficiently smaller than the contained amount of the silver particles contained in the paste. However, in the case of using the low-melting point glass frit, it is preferable that the low-melting point glass having the same primary component as the primary component of the low-melting point glass used for the glass layer 2 formed in the step 1 is used. Since the low-melting point glass of the bismuth oxide is preferably used as the low-melting point glass used in the step 1, it is preferable that the low-melting point glass to be mixed to the silver paste is the bismuth oxide. For practical purposes, less than 10 wt % (preferably, less than 5 wt %, particularly preferably, less than 1 wt %) of the low-melting point glass frit is contained in the paste and not less than 60 wt % and not more than 90 wt % of silver is contained in the silver paste where a wt % of the silver paste is 100. In addition, after drying and firing a silver paste (in the condition that the silver paste becomes a wiring or a conductive layer), a solvent component and a resin component contained in the paste are thermally decomposed and removed. Therefore, the wiring (the conductive layer) is substantially composed of silver and a frit glass.

Figure 4:
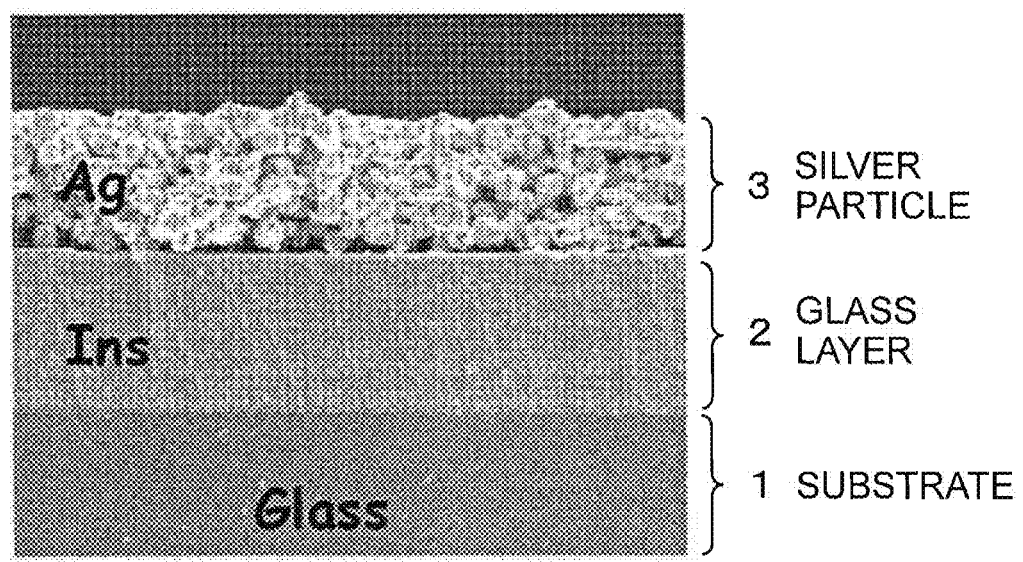
FIG. 4 is a cross sectional view for showing an example of a manner that a silver wiring is formed on a glass layer which is disposed on a glass substrate by a printing method.

It is possible to selectively dispose a paste containing many silver particles 3 (a silver paste) on the glass layer 2 by using a screen printing method. If the number of contained silver particles 3 (the contained amount) is increased, the silver particles can be connected to each other, so that the silver wiring (the silver conductive layer) can be disposed on the glass layer 2. The silver particles 3 contained in the paste adhere with each other by the glass frit contained in the paste or the silver particles 3 are directly contacted with each other by aggregation, sintering or the like, so that it is possible to form a wiring (a conductive layer). FIG. 1B paternally illustrates a configuration that the silver particles 3 are formed as a conductive layer. FIG. 4 illustrates an example when the silver wiring (the conductive layer) made of many silver particles 3 are formed on the glass layer 2 disposed on the glass substrate 1 by the printing method. In this state, a boundary between the conductive layer (the silver wiring) and the glass layer 2 is clearly defined and the conductive layer (the silver wiring) is mounted on the glass layer 2.

In addition, a photosensitive material may be further mixed in the silver paste. To use photosensitive silver paste (silver photo paste) mixed with photosensitive material is preferable because patterning can be carried out by a light and the conductive layer (the silver wiring) made of many silver particles 3 can be disposed on the glass layer 2 with a higher accuracy compared to the screen printing method. Further, the precious metal particles to be disposed on the glass layer 2 in the step 2 may be in a state obtained by applying the paste on the glass layer 2 and dried. In other words, it is not always necessary that the paste is fired to completely remove the solvent component and the resin component. The solvent component and the resin component contained in the paste may be sufficiently removed by heating in the following step 3.

(Step 3)

Figure 1C:
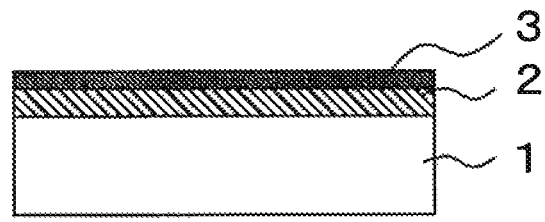

Next, by heating the glass layer 2 together with the silver particles 3 disposed on the glass layer 2, the silver particles 3 sink in the glass layer 2 (FIG. 1C).

Figure 5:
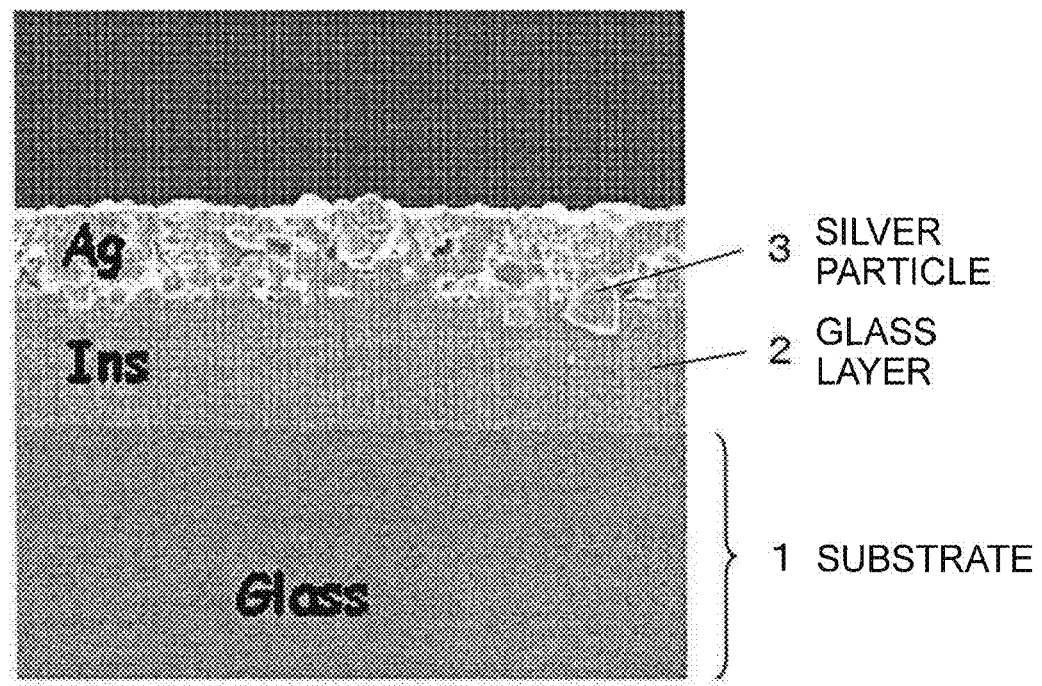
FIG. 5 is a cross sectional view for showing an example of a manner that silver particles sink in the glass layer which is disposed on the glass substrate.

The heating temperature in this step is lower than a softening point that the glass layer 2 itself originally has. If the glass layer 2 is heated at a higher temperature than the softening point that the glass layer 2 itself originally has (namely, the softening point applied when a glass layer is solely heated) and the glass layer 2 is made into a low viscosity state (for example, a melted state), the silver particles 3 and the glass layer 2 are mixed. However, according to the present invention, at a heating temperature lower than the softening point which is originally given to the glass layer 2, due to a mutual interaction between the glass layer 2 and the silver particles 3, the silver particles 3 sink in the glass layer 2 (the silver particles 3 and the glass layer 2 are mixed). In addition, as described later, if a particle diameter is made smaller, the silver particle 3 is also possible to sink in the glass layer 2 at a lower heating temperature compared to a glass transition point which is originally given to the glass layer 2. FIG. 5 shows an example when the silver particles 3 sink in the glass layer 2 which are disposed on the glass substrate 1 (the silver particles 3 and the glass layer 2 are mixed) by the present step. In FIG. 4 corresponding to the step 2, the silver particles 3 are placed on the glass layer 2, however, by the present step, the silver particles are put in the glass layer 2. In addition, as compared to a surface of a conductive layer of FIG. 4, as shown in FIG. 5, it is possible to improve a flatness of the surface of the conductive layer through the step 3.

A reason why such a phenomenon is caused is not clear. However, it is assumed that, since some catalyst effect is realized between the silver particles 3 and the glass layer 2, at a temperature which is lower than the softening point and the glass transition point that are originally provided to the glass layer 2, the glass layer starts to melt and the silver particles 3 are put in the glass layer 2 by its own weight or the like. Although it is described that "the silver particles 3 are put (or sink) in the glass layer 2", it is also possible to describe this as "the glass layer 2 that started to melt moves (or is sucked) between the silver particles 3 and it looks like that the silver particles 3 are put in the glass layer 3". In fact, a height, from the surface of the substrate 1, of a layered structure including the glass layer 2 and the silver particles (the silver wiring) 3 in the state of the step 2 decreases through the present step 3. The case that the silver wiring configured by many silver particles 3 is disposed on the glass layer 2 is explained here, however, even when one silver particle 3 is arranged on the glass layer 2, it is possible to put the silver particle 3 in the glass layer 2 in the same way.

Further, the above-described phenomenon may be realized also depending on the particle diameter of the silver particle 3. It is appreciated that the above-described phenomenon is remarkably realized when the particle diameter is in the range of not less than 1 μm and not more than 10 μm.

FIG. 7 shows an example of the case that the low-melting point glass of the bismuth oxide (the total amount of the bismuth oxide, the silicon oxide and the barium oxide is contained in the glass layer 2 in the range of not less than 60 wt % and not more than 70 wt % where wt % of the glass layer 2 is 100) is used as the glass layer 2. Further, FIG. 7 shows an example of a relation between the heating temperature in the step 3 and the particle diameter (the diameter) of the silver particle.

As shown in FIG. 7, it is appreciated that the silver particle 3 of a diameter in the range of not less than 1 μm and not more than 10 μm at a heating temperature lower than the softening point of the glass layer 2 (in this example, 510° C.) can be put in the glass layer 2. Further, a glass softening point (a Littleton point) indicates a temperature at which the viscosity of the glass layer 2 becomes $4.5 \times 10^7$ poise, for example. Then, the glass transition point indicates a temperature at which the viscosity of the glass layer 2 becomes $2 \times 10^{13}$ poise, for example. Then, when the glass layer 2 is softened till at least a viscosity which is defined by the glass transition point, it is possible to put the silver particle 3 in the glass layer 2. In the case that the glass layer 2 is softened up to the viscosity defined by the glass softening point, it is possible to put the silver particle 3 in the glass layer 2 with an excellent reproducibility. Then, the silver particle 3 of a diameter in the range of not less than 1 μm and not more than 4 μm can be put in the glass layer 2 at a lower heating temperature than the glass transition point that is originally provided to the glass layer 2 (in this example, 485° C.). By heating the structure provided with the glass layer 2 and the silver particle 3, the silver particle 3 of a diameter in the range of not less than 1 μm and not more than 10 μm can be put in the glass layer 2 at a lower temperature than the softening temperature of the glass layer 2. Here, in the case of using silver particles 3 of a diameter in the range of not less than 1 μm and not more than 10 μm for example, the heating temperature means a temperature lower than the glass softening point that is originally provided to the glass layer 2 (preferably, a temperature lower than the glass transition point). Then, the heating temperature also means a temperature not less than "a temperature for putting" (temperature allowing to put) the silver particle in the glass layer 2. Therefore, it can be said that a lower limit of the heating temperature is a temperature at which the viscosity of the glass layer 2 is not more than $2 \times 10^{13}$ poise, and particularly, it is practically preferable that the viscosity of the glass layer 2 is not more than $4.5 \times 10^7$ poise. And practically, a lower limit of the heating temperature is not less than 440° C. When the temperature is at least not less than 440° C., in the case of using the above-described low-melting point glass of the bismuth oxide as the glass layer 2, "many silver particles can be put in the glass layer" or "glass composing the glass layer can be inserted among a plurality of silver particles". Further, when the diameter of the silver particle 3 is less than 1 μm, a temperature at which the silver particles 3 are connected (fused or sintered) with each other becomes lower, and as a result, it is conceivable that it is difficult for the glass to insert among the silver particles 3 and therefore the silver particle 3 cannot be put in the glass layer 2. In addition, in the case of printing the silver paste with a photosensitivity and patterning by exposing and developing, the smaller the particle diameter of the silver particle 3 is, the longer it takes a time for an exposure step. Therefore, when the particle diameter of the silver particle 3 is less than 1 μm, a photo polymerization reaction is not sufficient by a general exposure and an exposure amount is short, so that patterning cannot be carried out effectively. In addition, the trend shown in FIG. 7 is almost the same with respect to the glass layer 2 which is formed by using other low-melting point glass frit. Therefore, in the case of using the silver particle in the range of not less than 1 μm and not more than 10 μm, it is possible to melt the glass layer 2 at a temperature that is lower than the original softening point and the original glass transition point of the glass layer 2.

Through the above-described steps 1 to 3, it is possible to put a silver particle 3 in the glass layer 2. Therefore, if the silver particle 3 is disposed on the glass layer 2 in a wire shape (a conductive layer shape) in step 2, as shown in FIG. 5, it is possible to integrate the glass layer 2 with the silver wiring (the silver particle) 3 and it is possible to realize a configuration which looks like that the silver wiring (the silver particle) 3 is put in the glass layer (the insulating layer) 2. Therefore, according to the present invention, even if the wiring and the insulating layer are formed by the printing method or the like, a wiring board with an excellent flatness of the surface can be formed.

Here, the case of using the silver particle is described. According to the present invention, it is the most preferable that the silver particle is used, however, the present invention is not limited to the silver particle and a precious metal such as Au, Pd, and Pt can be similarly used other than silver.

In addition, the example that the glass layer (the insulating layer) 2 is directly disposed on the substrate 1 is shown here, however, it is possible to dispose a wiring (a lower wiring) between the substrate 1 and the glass layer 2. Thus, disposing the lower wiring allows to easily obtain the structure to have isolation between the silver wiring 3 integrated with the glass layer 2 and the lower wiring. Therefore, it is possible to form the wiring board which is provided with two wirings stacked through the insulating layer. Arranging the lower wiring and the upper wiring (the silver wiring 3) so as to intersect with each other, it is possible to form the wiring board provided with the matrix wiring.

Further, arranging many electron-emitting devices on the substrate provided with the matrix wiring and connecting respective electron-emitting devices to the upper wiring and the lower wiring, it is possible to configure an electron source of a matrix structure. In the case of configuring the electron source, other than the matrix structure, the electron source can be also configured by disposing a plurality of the above-described silver wirings 3 in parallel with each other at intervals and connecting respective electron-emitting devices to the adjacent two silver wirings. Then, if the image display apparatus is configured by using such an electron source, it is possible to obtain an image display apparatus having decreased influence of a trajectory of an electron emitted from the electron-emitting device caused by concavity and convexity of the peripheral structure. Further, as the electron-emitting device which can be applied to the present invention, not only a surface conduction electron-emitting device but also a field emission type electron-emitting device using a carbon fiber such as a carbon nano tube, a metal-insulator-metal type electron-emitting device or the like can be used.

Figure 6:
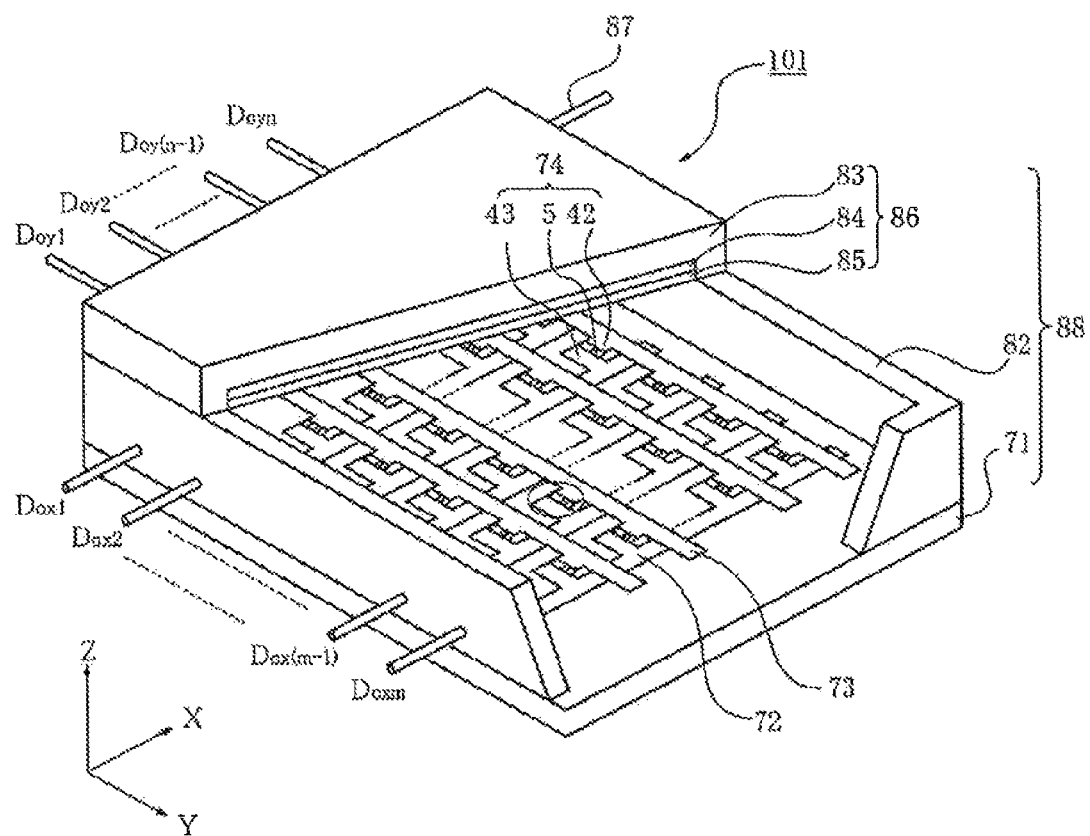
FIG. 6 is a view showing an example of an image display apparatus including an electron source which is configured by arranging surface conduction electron-emitting devices on a substrate provided with a matrix wiring.

FIG. 6 shows an example of an image display apparatus provided with an electron source configured by arranging a surface conduction electron-emitting device on a substrate provided with a matrix wiring.

An X-directional wiring 72 is equivalent to the lower wiring and a Y-directional wiring 73 is equivalent to the above-described upper wiring (the silver wiring) 3. In FIG. 6, the glass layer 2 is not described for simplification of the explanation. A surface conduction electron-emitting device 74 is configured with a pair of electrodes 42 and 43 and a conductive film 5 having a gap.

A rear plate 71 is equivalent to the above-described substrate 1. A reference numeral 86 denotes a face plate and on the surface of a glass substrate 83, a light-emitting layer 84 emitting a light due to irradiation of an electron ray and an anode electrode 85 are disposed. The anode electrode 85 can be configured with an aluminum film. A support frame 82 is disposed between the rear plate 71 and the face plate 86. A container 88 is configured with the rear plate 71, the face plate 86, and the support frame 82, of which interior part is held to be vacuum (a pressure lower than an atmosphere pressure). Terminals (Dox1 to Doxm) are connected to each of m pieces of X-directional wirings 72 and in the same way, terminals (Doy1 to Doym) are connected to each of n pieces of Y-directional wirings 73. A terminal 87 to be connected to a high-voltage power supply is connected to the anode electrode 85. An image display apparatus 101 is configured with this container 88 and a driving circuit (not illustrated).

In addition, by using the image display apparatus 101 according to the present invention described with reference to FIG. 6, it is possible to configure an information display reproducing apparatus.

Specifically, the information display reproducing apparatus is provided with a receiving apparatus and a tuner for selecting a received signal to output the signal included in the selected signal to the image display apparatus 101 and display or reproduce it on a screen. The receiving apparatus can receive a broadcast signal such as TV broadcasting. In addition, a signal included in the selected signal may include at least one of video information, text information, and audio information. Further, the "screen" is equivalent to the light-emitting layer 84 in the image display apparatus 101 shown in FIG. 6. With this structure, the information display reproducing apparatus such as a television set can be configured. It is obvious that the information display reproducing apparatus according to the present invention may include a decoder when the broadcast signal is encoded. By outputting voice information to a voice reproducing means such as a speaker which is separately provided, the voice information is reproduced in synchronization with image information and character information to be displayed on the image display apparatus 101.

A method for displaying and/or reproducing the video information or the text information on the image display apparatus 101 by outputting the video information or the text information on the screen will be carried out, for example, as below. At first, an image signal corresponding to each pixel of the image display apparatus 101 is generated from the received video information or the text information. Then, the generated image signal is inputted in a driving circuit of the image display apparatus 101. Further, controlling a voltage to be applied to each electron-emitting device in the image display apparatus 101 by means of the driving circuit on the basis of the image signal inputted in the driving circuit, the image is displayed.

When the thickness of the insulating layer (the glass layer 2) between the lower wiring and the upper wiring (the silver wiring 3) is controlled, it is also possible to connect the upper wiring to the lower wiring without disposing a contact hole. Therefore, a functional device to be disposed on the wiring board according to the present invention is not limited to the above-described electron-emitting device but various functional devices such as a TFT can be used. By connecting these functional devices to the wiring, various electron devices can be configured.

First Embodiment

Hereinafter, a method for putting silver according to a first embodiment of the present invention will be described with reference to the drawings.

At first, as shown in FIG. 1A, an insulating paste is formed on the glass substrate 1 by the printing method. Next, by drying and firing the insulating paste, the glass layer 2 is formed. As a low-melting point glass frit composing the insulating paste, a low-melting point glass frit of a bismuth oxide including $Bi_2O_3$, ZnO, and BaO in the range of not less than 60 wt % and not more than 70 wt % is used.

Then, on the glass layer 2, a photosensitive paste containing a silver particle, of which particle diameter (a diameter of a particle) is not less than 2 μm and not more than 3 μm, is formed by a printing method, after drying the photosensitive paste, exposure and developing processing are carried out to leave a predetermined pattern (a precursor film of the silver wiring 3). Further, the precursor film may contain many silver particles. Next, by firing at 360° C., the silver wiring is disposed on the glass layer 2 (FIG. 1B). In this step, a boundary between the silver wiring 3 and the glass layer (the insulating layer) 2 is clearly defined as shown in a cross section of FIG. 4.

Consequently, by heating the whole substrate 1 at 480° C., the silver wiring 3 is put in the glass layer 2 (FIG. 1C). As shown in a cross sectional view of FIG. 5, glass is inserted between the silver particles and a clear boundary between the glass layer 2 and the silver wiring 3 is vanished. Thus, some places of the surface of the silver wiring 3 are exposed, however, the silver wiring 3 is almost put in the glass layer 2.

Further, the original glass transition point of the glass layer 2 is 485° C. and the softening point is 510° C. However, the silver wiring can be input in the glass layer 2 at a heating temperature which is lower than 485° C. and 510° C.

Second Embodiment

FIG. 2 is a pattern cross sectional view for showing a process for putting a silver wiring according to a second embodiment of the present invention.

Figure 2A:
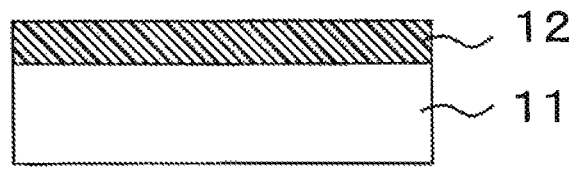
FIGS. 2A to 2E are cross sectional views for showing a process for putting a silver wiring according to a second embodiment of the present invention.

At first, as shown in FIG. 2A, a photosensitive insulating paste is printed on a glass substrate (a silica glass substrate) 11. As a glass frit contained in an insulating paste, the same one as the first embodiment is used.

Figure 2B:
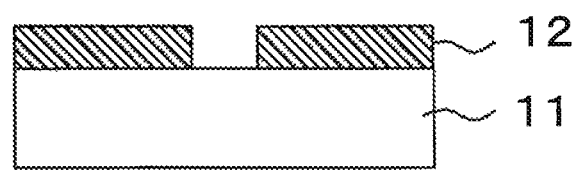

Next, after drying the insulating paste, the exposure and the development processing are carried out for patterning, then, by firing the paste, the two separated glass layers (the insulating layers) 12 are formed on the glass substrate 11 (FIG. 2B).

Figure 2C:
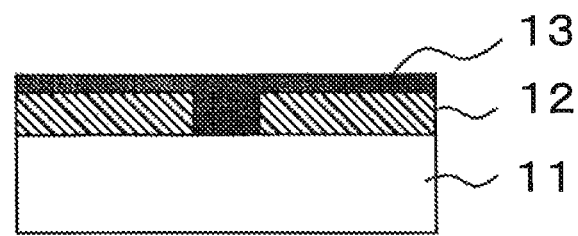

Next, as shown in FIG. 2C, a photosensitive silver paste using a silver particle of which particle diameter is 1 μm is printed on the entire surface of the glass substrate 11.

Figure 2D:
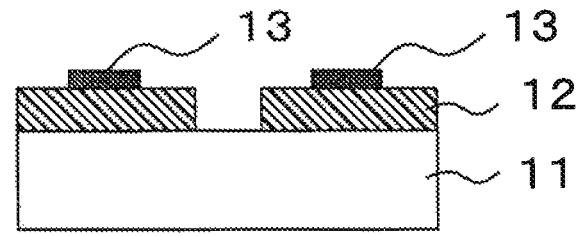

Consequently, by carrying out drying, exposure, and the development processing on the printed silver paste, for patterning and precursor films 13 are arranged on each of two glass layers 12 (FIG. 2D). Further, each of the precursor films 13 may contain many silver particles.

Figure 2E:
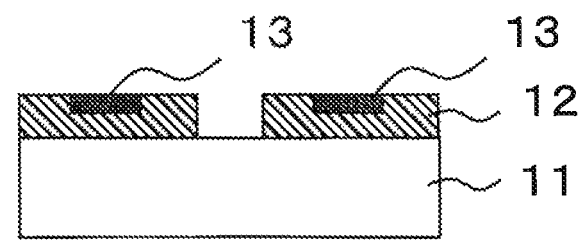

Subsequently, by heating the glass layer 12 and the precursor film of the silver wiring together with the substrate 11 for twenty minutes at a temperature lower than the softening point and the glass transition point of the glass layer 12, the silver wiring 13 put in each glass layer 12 is obtained as the first embodiment (FIG. 2E).

Thus, according to the present embodiment, the silver wiring 13 put in each glass layer 12 can be obtained. Conventionally, in order to obtain the put wiring, a groove is formed on the substrate and the silver paste is printed in this groove so as to form the wiring, however, according to the present invention, without performing the processing step of the groove on the substrate, it is possible to form a wiring board having a high flatness of the surface.

Third Embodiment

FIG. 3 is a cross sectional view for showing a process for putting a contact electrode according to a third embodiment of the present invention.

Figure 3A:
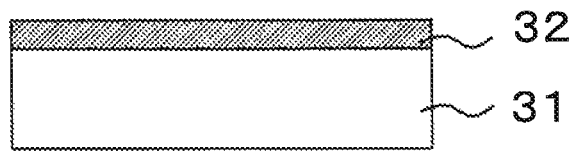
FIGS. 3A to 3E are cross sectional views for showing a process for putting a contact electrode according to a third embodiment of the present invention.

At first, as shown in FIG. 3A, a first wiring (a conductive layer) 32 is formed on a glass substrate 31 according to a printing method.

Figure 3B:
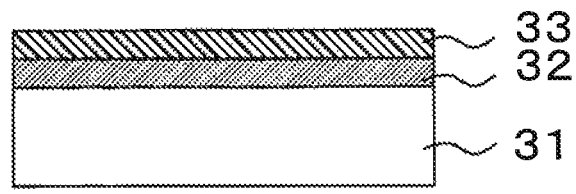

Next, an insulating paste of the same photosensitivity as the paste which is used according to the second embodiment is printed on the first wiring 32. Then, by carrying out drying, exposure, development, heating, and firing, an insulating layer (a glass layer) 33 is formed (FIG. 3B).

Figure 3C:
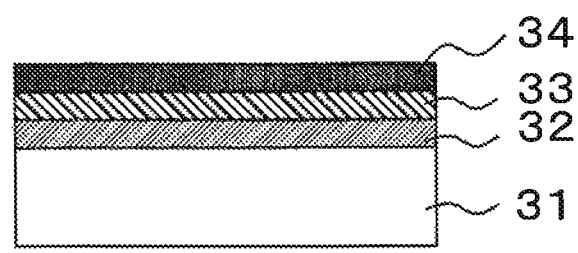

Consequently, a photosensitive silver paste using a silver particle 34 of which particle diameter is not less than 2 μm and not more than 3 μm is printed on the insulating layer 33 (FIG. 3C).

Figure 3D:
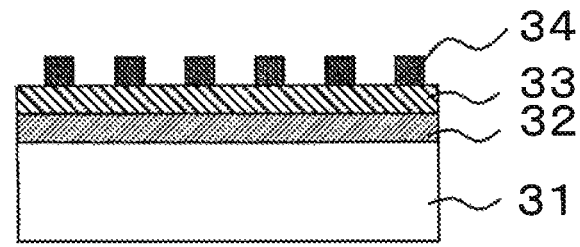

After that, drying, exposure, and development are carried out and patterning is carried out so that the precursor films 34 are located on the first wiring 32 (FIG. 3D). Further, each of the precursor films 34 may contain many silver particles.

Figure 3E:
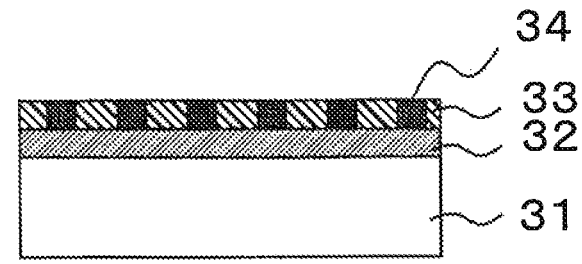

Next, by heating the paste at 480° C., which is lower than the original glass transition point (485° C.) of the glass layer 33, a contact electrode 34 that is put in the insulating layer 33 and is connected to the first wiring 32 can be formed as shown in FIG. 3E, as the first embodiment.

Thus, according to the present embodiment, without forming the contact hole, it is possible to easily form a contact electrode for connection to the wiring (the conductive layer) which is located under the insulating layer and it is possible to obtain a wiring substrate having an excellent flatness.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-206053, filed on Jul. 28, 2006, which is hereby incorporated by reference herein in its entirety.

The invention claimed is:

1. A method for manufacturing an electronic substrate structure comprising a substrate, a glass layer, and a conductive layer, the method comprising the steps of:
    arranging the glass layer on the substrate;
    arranging the conductive layer on the glass layer while directly contacting the glass layer, wherein the conductive layer includes a precious metal particle, the particle having a diameter not less than 1 μm and not more than 10 μm; and
    heating the glass layer together with the conductive layer at a temperature that is lower than a softening point of the glass layer so that the particle is put into the glass layer.

2. The method according to claim 1, wherein the conductive layer is disposed on the glass layer by printing and firing a paste, where the paste has the same main component as the main component of the glass layer.

3. The method according to claim 2, wherein the glass layer contains a bismuth oxide, a barium oxide, and a lead oxide.

4. The method according to claim 2, wherein a temperature for heating the glass layer is not less than 440° C.

5. The method according to claim 2, wherein a temperature for heating the glass layer is not less than a temperature at which a viscosity of the glass layer becomes $2 \times 10^{13}$ poise.

6. The method according to claim 2, wherein the precious metal particle is a silver particle.

7. The method according to claim 2, wherein a temperature for heating the glass layer is a temperature which is lower than a glass transition point of the glass layer.

* * * * *